United States Patent [19]
Jacobson et al.

[11] Patent Number: 5,841,867
[45] Date of Patent: Nov. 24, 1998

[54] ON-CHIP PROGRAMMING VERIFICATION SYSTEM FOR PLDS

[75] Inventors: Neil G. Jacobson, Mountain View; Derek R. Curd, San Jose, both of Calif.

[73] Assignee: Xilinx, Inc., San Jose, Calif.

[21] Appl. No.: 742,711

[22] Filed: Nov. 1, 1996

[51] Int. Cl.$^6$ .................................................. H04L 9/00
[52] U.S. Cl. ................................. 380/25; 380/4; 326/39
[58] Field of Search ........................... 380/4, 25; 326/38, 326/39, 46; 324/158.1; 365/185.22; 371/22.5

[56] References Cited

U.S. PATENT DOCUMENTS

| | | | |
|---|---|---|---|
| 5,315,177 | 5/1994 | Zagar et al. | 326/44 |
| 5,485,467 | 1/1996 | Golnabi | 371/22.5 |
| 5,541,879 | 7/1996 | Suh et al. | 365/185.22 |
| 5,617,021 | 4/1997 | Goetting et al. | 324/158.1 |
| 5,672,966 | 9/1997 | Palczewski et al. | 324/158.1 |

*Primary Examiner*—Salvatore Cangialosi
*Attorney, Agent, or Firm*—J. D. Harriman; Hecker & Harriman; Jeanette S. Harms

[57] ABSTRACT

The present invention provides an efficient programming verification system for Programmable Logic Devices (PLDs). Based upon IEEE JTAG standard boundary scan test architecture, the invention provides a novel test architecture including a configuration register and a signature analyzer coupled between the TDI and TDO pins of the JTAG architecture. The configuration register of the invention comprises three parts: an address register/counter, a data register, a status register. The address register/counter performs dual functions depending upon an instruction received by an instruction register. The invention eliminates the need to load each address sequentially into the address register/counter for programming by enabling the address register/counter to auto-increment the address for memory locations. After loading an initial address value, the address register/counter automatically increments the address for programming memory cells. To verify PLD programming, the invention applies a signature analyzer coupled between the TDI and TDO pins. A single input linear feedback shift register (SISR) or multiple LFSR (MISR) can be used to implement a signature analyzer in accordance with the invention. SISR or MISR uses a characteristic polynomial to generate a near-unique signature checksum for an input sequence. The accumulated signature checksum is then provided serially through the TDO pin for inspection.

27 Claims, 9 Drawing Sheets

ON-CHIP PROGRAMMING VERIFICATION SYSTEM FOR PLDS

BACKGROUND OF THE INVENTION

1. Field of the Invention

This invention relates to the design of integrated circuit design and particular, to the design of programmable logic devices.

2. Background Art

A PLD (programmable logic device) is a digital integrated circuit capable of being programmed to provide a variety of different logic functions. A PLD generally includes AND gates, OR gates, and Input/Output buffers, and functions differently depending on how it is programmed. The programming is achieved using on-chip fuses, EPROM (UV erasable programmable read-only memory) circuits, EEPROM (electrically erasable programmable read-only memory) circuits, and RAM (random access memory) circuits which programmably create data paths and logic functions within the device that are specific to the user's design.

State of the art PLDs make use of one or more non-volatile memory cell (e.g. EPROM, EEPROM, Flash EPROM, or Flash EEPROM) arrays so that they can retain their configuration memory during power-down. Typically, these arrays are erasable, thereby allowing the desired functionality of the PLD to be re-programmed many times. This programmability makes a PLD family a flexible and powerful tool for a large number of unique applications where a common PLD is employed and only the chip's internal programming is varied.

A block diagram of a prior art Complex Programmable Logic Device (CPLD) architecture with ISP is shown in FIG. 1. As is well known to those in the art, the term In-System Programming (hereinafter ISP) refers to the process of programming, erasing, and verifying a device in-system. Therefore, ISP encompasses the actions of erasing and verifying the design in the device in addition to the specific action of memory cell programming. In-system programming offers quick and efficient design iterations and reduces package handling.

In FIG. 1, I/O Blocks (IOBs) 103 are coupled to JTAG (Joint Test Action Group) controller 101 and switch matrix 104. Switch matrix 104 is coupled to ISP controller 102 and Function Blocks (FBs) 105, 106, and 107. Each configurable function block in FIG. 1 may perform any one of a variety of logic functions.

The logic function performed by a particular function block is defined by data stored in its associated configuration memory cells. Configuring or programming the CPLD is achieved by an ISP controller which writes configuration data into configuration memory cells. The memory cells can be placed in a Function Block (FB) or I/O Block (IOB) that they configure or program, or can be arranged in an array of cells in columns and rows as routing permits. A typical CPLD has tens of thousands of memory cells.

Typically, verification is required after programming to ensure that the memory cells have been properly programmed and that the PLD is functional to the design specification. Verification of a PLD involves a combination of in-circuit functional testing, simulation, timing analysis, and memory cell verification. Memory cell verification is especially important in that it determines whether a PLD has been programmed correctly according to the design specification, and thus must be performed before shipping to a user or using the device for an actual application.

In integrated circuit testing, a technique called "boundary scan" has been developed to define a standard test logic architecture for implementing boundary scan functions which can be included in an integrated circuit for the purpose of testing the integrated circuit. This standard architecture was approved on Feb. 15, 1990 by the Institute of Electrical and Electronics Engineers (IEEE) and is commonly referred to as JTAG (Joint Test Action Group) or IEEE Standard 1149.1.

FIG. 2 shows a block diagram of the boundary scan test logic according to IEEE Standard 1149.1 or JTAG. The test architecture is defined to include a test access port (TAP) having connections for a test clock pin 209 (TCK), a test mode select pin 208 (TMS), a test data input pin 205 (TDI) and a test data output pin 207 (TDO). The test architecture also includes a TAP controller 201 (boundary scan state machine). Finally, the test architecture includes an instruction register and a group of test data registers. The test data registers include at least a bypass register 206A and a boundary scan register 206B.

The TAP controller 201 is a 16-state Finite State Machine that provides the control logic for JTAG. TMS pin 208 provides signals to control the state transitions of the TAP controller 201. TCK pin 209 provides clock signals to synchronize TAP controller 201, instruction register 203, bypass register 206A, and boundary scan register 206B.

Referring to FIG. 2, TDI pin 205 provides the serial input to all JTAG instruction and data registers. The state of the TAP controller 201 as well as the particular instruction held in the instruction register determines which register is fed by TDI for a specific operation. TDO pin 207 is the serial output for all JTAG instruction and data registers, and is driven by register 204.

The system logic 212 is selectively coupled to a plurality of input/output pins 211 so that either signals from system logic 212 or boundary scan register 206B drive I/O pins 211.

The JTAG standard creates a means of verifying the integrity of traces between components on an assembled printed circuit board by providing a standard architecture and a set of mandatory public instructions that all vendors claiming conformance to IEEE standard 1149.1 must support. The mandatory instructions set is set forth in Table 1 below.

TABLE 1

| Instruction | Function | OpCode |
| --- | --- | --- |
| BYPASS | enables the bypass register, effectively causing the device to be bypassed. | 11111111 |
| SAMPLE/PRELOAD | selects the boundary scan register between TDI and TDO | 00000001 |
| EXTEST | selects the boundary scan register between TDI and TDO | 00000000 |

Previous test methods for PLDS, however, provided only limited capability to perform the memory cell verification and check programming data integrity, and included serious drawbacks. One prior art memory cell verification method involves generating a large number of simulation/test vectors and observing the response thereto of a PLD. For example, the simulation/test vectors are loaded to one of the test data registers 206 in a JTAG architecture for each programmable memory cell. The vector contains the address and the expected data of a configuration memory cell. The data contained in each addressed memory cell is then accessed compared with the expected data.

The verification routine described above requires reading back the value of each and every memory location and comparing it with its expected value. Thus, given the large number of memory locations involved, verification can be time-consuming and consumes other valuable system resources such as memory. For example, an address field of sixteen (16) bit wide can cover as many as $2^{16}$ (64K) address locations. If there is an eight bit register at each of the $2^{16}$ (64K) address locations, then each bit in a stream of $8\times2^{16}$ (64K)=512 Kbits of data needs to be evaluated. This would require storing a half million bits of data and comparing them with the data read out of the $2^{16}$ (64K) registers.

Thus, the existing prior art verification methods are both time-consuming, often on the same order-of-magnitude as the time required for programming, and resource-intensive, resulting in a significant increase in the test/verification cost. For users and vendors to whom memory and time are two valuable resources, the prior art verification method is not the most efficient solution.

SUMMARY OF THE INVENTION

The present invention provides an efficient programming verification system for Programmable Logic Devices (PLDs). Based upon IEEE JTAG standard boundary scan test architecture, the invention provides a novel test architecture including a configuration register and a signature analyzer coupled between the TDI and TDO pins of JTAG architecture.

The configuration register of the invention comprises three parts: an address register/counter, a data register, and a status register. The address register/counter performs dual functions depending upon a JTAG instruction received by instruction register. For PLD programming instructions, the address register/counter specifies an address of the memory location to which data is directed. The data to be written is latched into the data register part of the configuration register. The invention eliminates the need to load each address sequentially into the address register/counter for programming by enabling the address register/counter to auto-increment the address for memory locations. After loading an initial address value, the address register/counter automatically increments the address for programming memory cells, thereby reducing the amount of test vectors that are applied at the TDI pin for programming verification.

To verify PLD programming, the invention applies a signature analyzer coupled between the TDI and TDO pins. Using the address auto-increment feature, a verification instruction accumulates output data from all desired memory locations and produces a signature checksum. A single input linear feedback shift register (SISR) or multiple LFSR (MISR) can be used to implement a signature analyzer in accordance with the invention. SISR or MISR uses a characteristic polynomial to generate an assumed unique signature checksum for an input sequence. The accumulated signature checksum is then provided serially through the TDO pin for inspection. A comparison of the signature checksum obtained from the signature analyzer and the value of expected signature reveals whether there is a fault or error in programming. Using the signature analyzer significantly reduces both the time required for verification and the test vector volume.

DETAILED DESCRIPTION OF THE INVENTION

The present invention is a boundary scan testing system described with respect to PLDS. In the following description, numerous specific details are set forth to provide a more thorough description of the present invention. It will be apparent, however, to one skilled in the art, that the present invention may be practiced without these specific details. In other instances, well known features have not been described in detail so as not to obscure the present invention.

Figure 1:
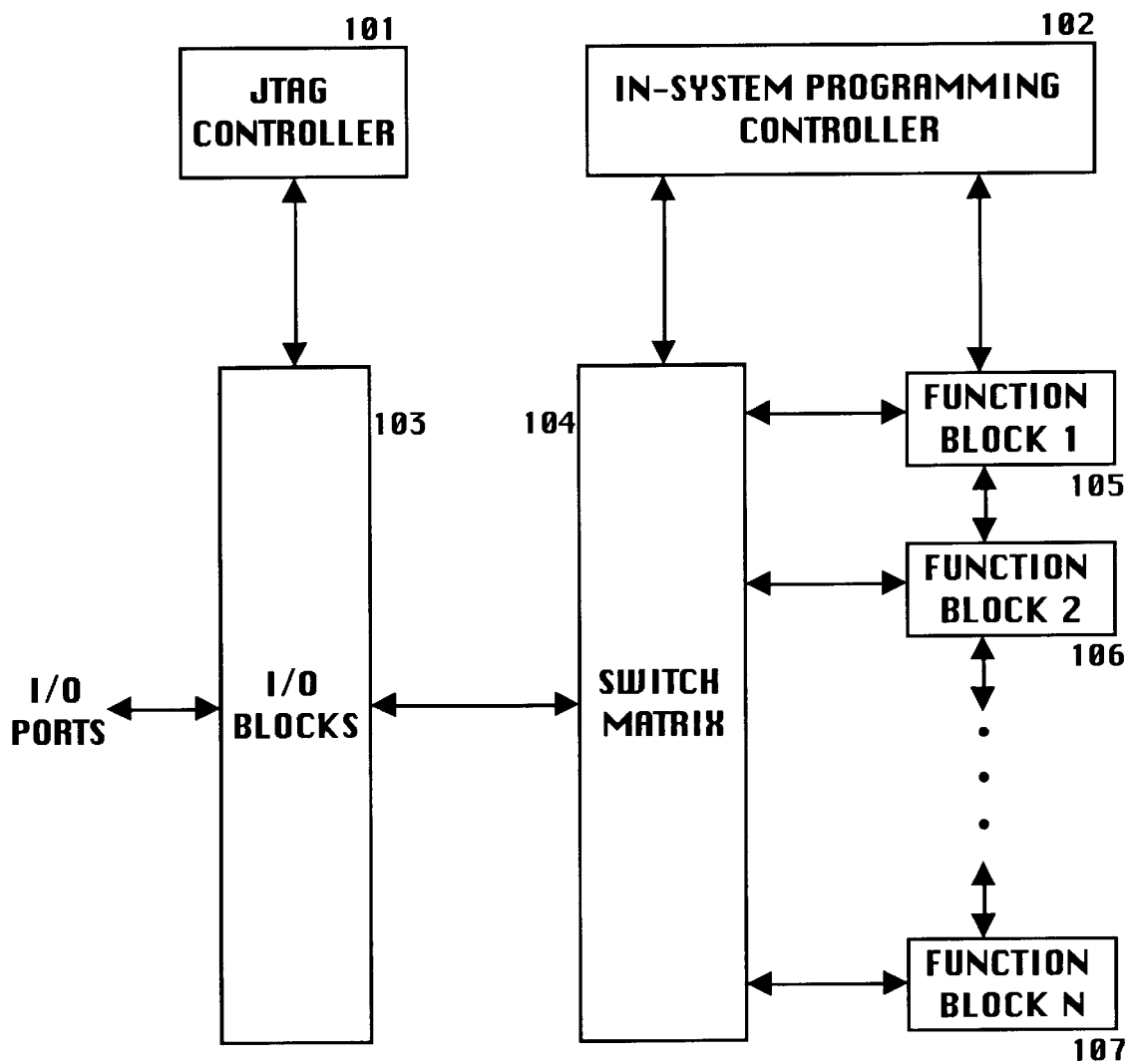
FIG. 1 is a block diagram of a prior art PLD architecture with an ISP feature.
Figure 2:
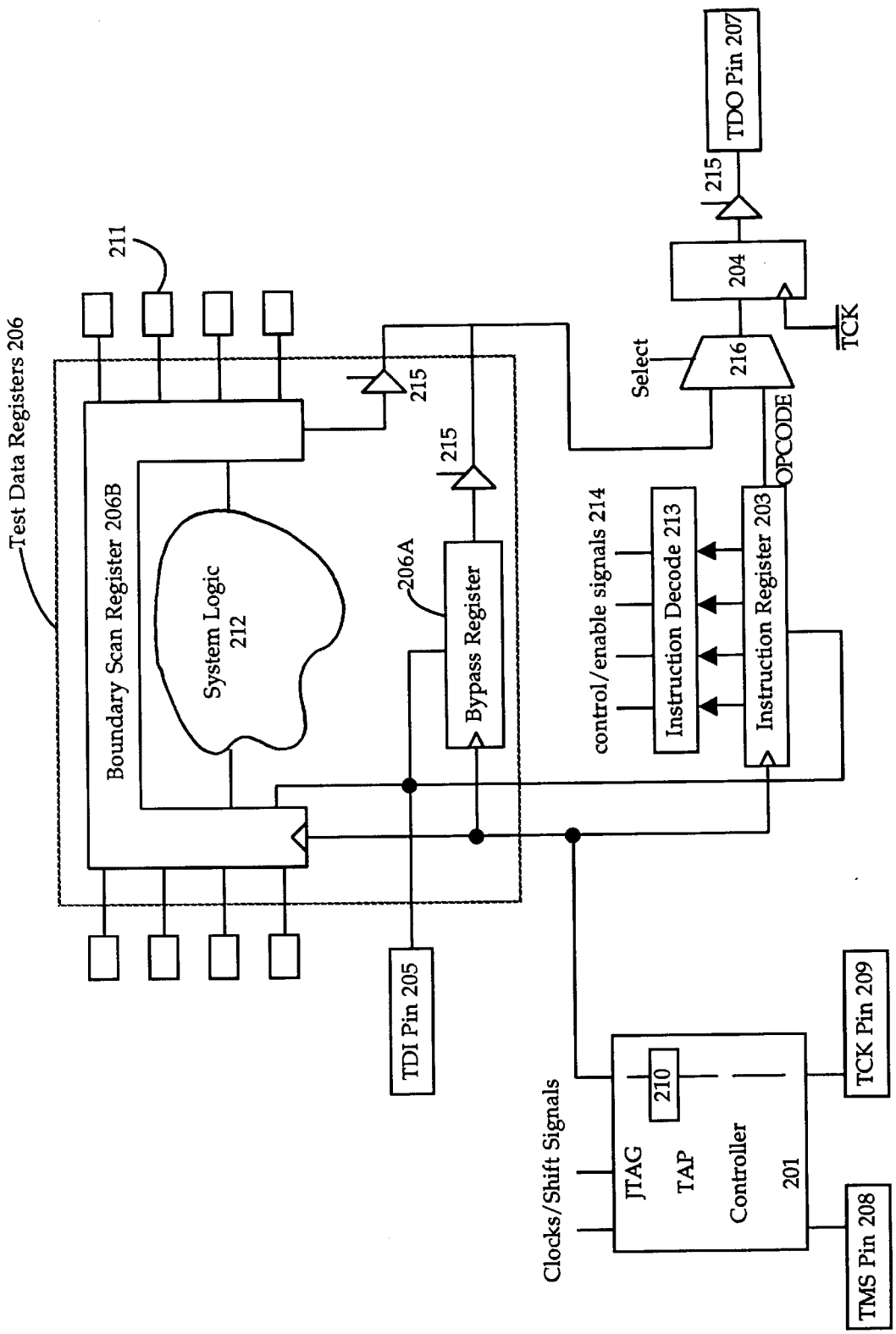
FIG. 2 shows a block diagram of the boundary scan test logic according to IEEE Standard 1149.1.
Figure 3:
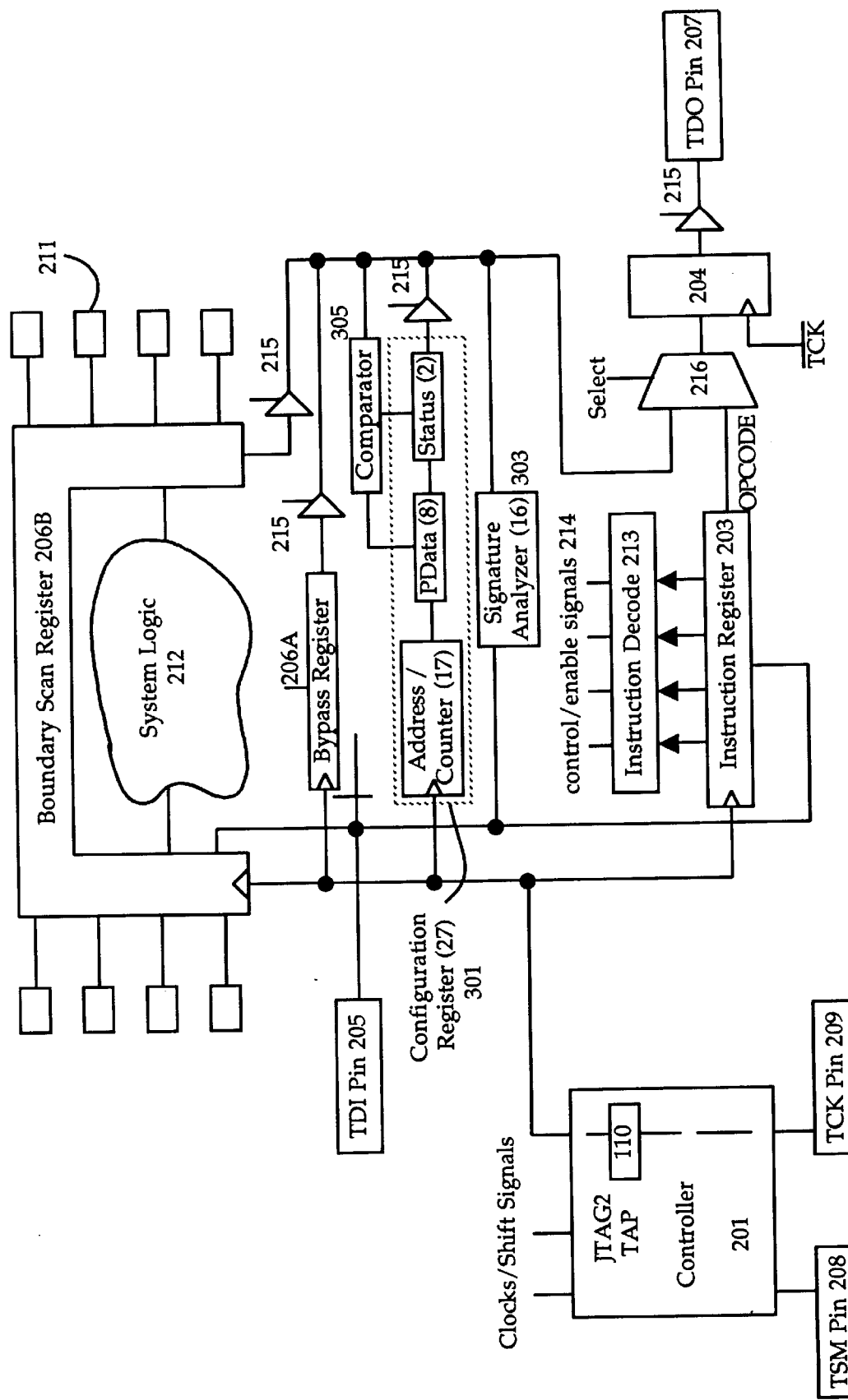
FIG. 3 shows a block diagram of the boundary scan JTAG architecture in one embodiment of the invention.

FIG. 3 shows a block diagram of the boundary scan JTAG architecture in one embodiment of the invention. In FIG. 3, in addition to mandatory JTAG features of FIG. 2, other features are added that comply with JTAG standards, including a Signature Analyzer 303 and a Configuration Register 301.

Figure 4:
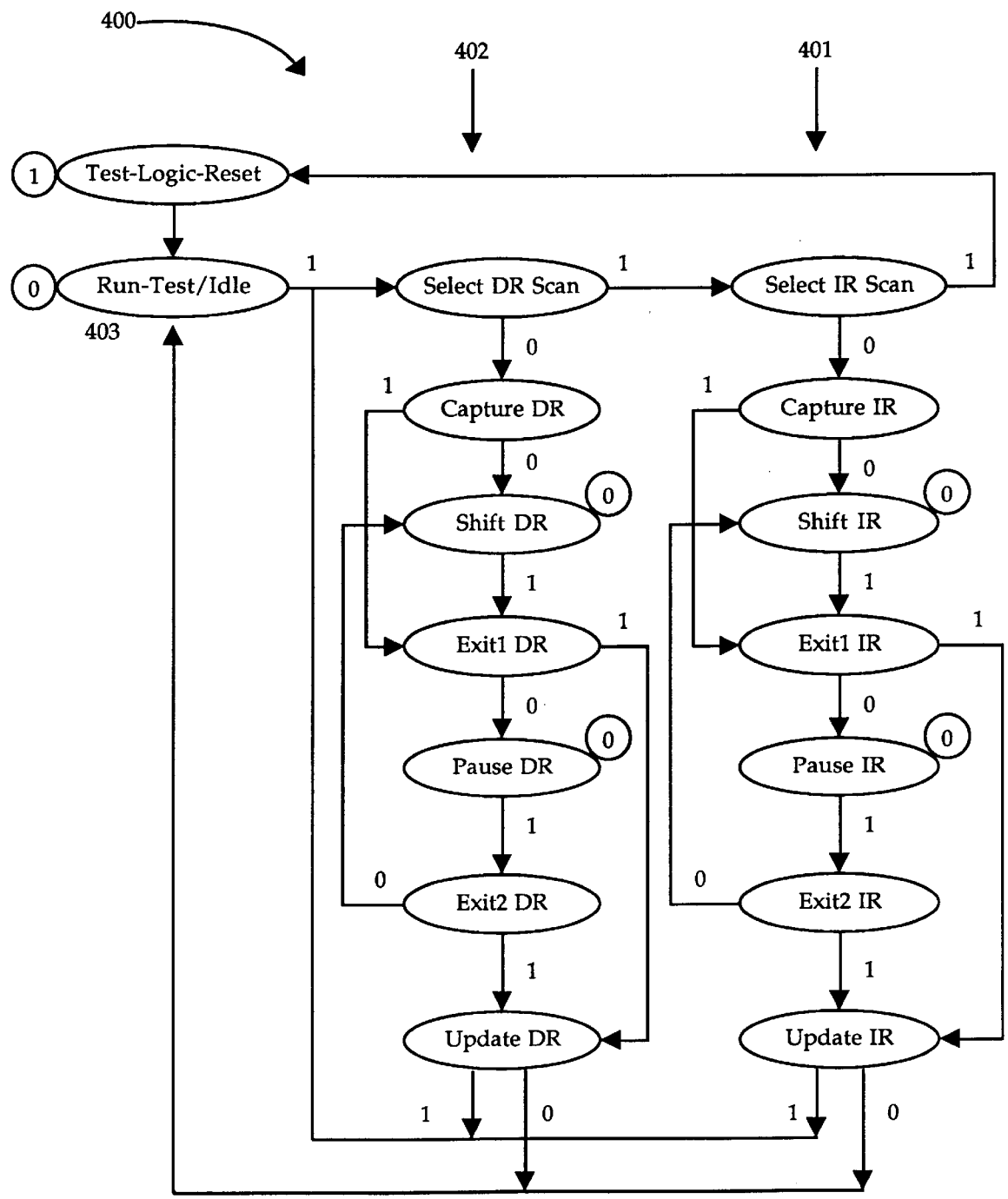
FIG. 4 shows a state diagram of a TAP controller according to the invention.

In this embodiment, a boundary scan state machine is implemented in accordance with IEEE standard 1149.1. FIG. 4 shows a state diagram of a TAP controller according to the invention. Referring to FIG. 4, a first sequence 401 of state transitions shifts instructions to instruction register 203 and a second sequence 402 of state transitions shifts data to one of the test data registers 206. The Run-Test-Idle state 403 is used to initiate ISP operations. State diagram 400, which is described in the IEEE Standard 1149.1 pages 5–1 to 5–16, is well known to those in the art and, therefore, is not explained in detail herein.

The instruction register 203 in the embodiment shown in FIG. 3 is eight (8) bits long, IR[7:0], and is connected between TDI pin 205 and TDO pin 207 during an instruction scan sequence. The 8-bit parallel output of the instruction register 203, which feeds the instruction decoder 213, is updated on the falling edge of TCK in the Update-IR state with the values shifted into the register during the Shift-IR state. Instruction decoder 213 is responsible for decoding the current instruction, and in some cases the state of the TAP controller 201, to produce the necessary control signals for the JTAG test logic. Instruction decoder 213 also determines which data register is selected between TDI pin 205 and TDO pin 207 for the current instruction.

IEEE standard 1149.1 defines mandatory instructions set for any component that claims compliance to the standard. These mandatory instructions include BYPASS, SAMPLE/PRELOAD, and EXTEST as discussed above. In addition to these public mandatory instructions set, the IEEE standard 1149.1 allows for optional or private instructions set. Thus the optional instruction set space can be used to implement some user-defined functions.

Table 2 illustrates an example of optional instructions set to implement optional and ISP features for a PLD according to one embodiment of the invention.

TABLE 2

| Instruction | Function | OpCode |
| --- | --- | --- |
| INTEST | selects the boundary scan register, allowing input pins to be driven by values shifted in from boundary scan register | 00000010 |
| IDCODE | selects identification register, allowing manufacturer's ID to be loaded | 11111110 |
| USERCODE | selects identification register, allowing USER ID to be loaded | 11111101 |
| HIGHZ | enables bypass register, causing tri-state on all component outputs | 11111100 |
| ISPEN | selects ISP enable register | 11101000 |
| FPGM | enables configuration register, used to program memory cells | 11101010 |
| FVFY | enables configuration register, used to verify the content of memory cells | 11101110 |
| FERASE | enable configuration register, used to erase a sector of memory cells | 11101100 |
| CONLD | reconfigures memory cells without powering down the device | 11110000 |

Referring to FIG. 3, a bypass register 206A is a one stage shift register that is connected between TDI and TDO. Bypass register 206A allows the system logic 212 to be effectively removed or "bypassed" from a JTAG chain of many components if no JTAG function is desired at the current time. The boundary-scan register 206B is used to control and observe the state of all component, or user pins. Each I/O pin 211 has three shift register stages associated with it that, when linked together with the stages from other pins, in a specified sequence, form the boundary-scan register.

The configuration register 301 is a total of twenty-seven (27) bits long and contains seventeen (17) bits of address field, AD[16:0], in its most significant portion, followed by eight (8) bits of PDATA field, PD[7:0], and two (2) bits of status field, ST[1:0], in its least significant portion. During an FPGM, FVFY, or FERASE instruction, the entire twenty-seven (27) bit configuration register 301 is connected between TDI pin 205 and TDO pin 207, allowing the address, data, and status bits to be loaded. The seventeen (17) bit shift register portion of the configuration register 301 is implemented to perform dual function as a regular seventeen (17) bit shift register and as an auto-increment counter depending on a control signal.

The FPGM instruction is used to program the memory cells specified by the seventeen (17) address bits of configuration register 301. To perform a programming operation in the present invention, an address/data packet with a status field code of "10" is shifted into configuration register 301 under control of TAP controller 201. After TAP controller 201 transitions to the Run-Test-Idle state 403 (FIG. 4), controller 201 detects status code "10", thereby triggering a programming pulse for the data stored in data field of configuration register 301 to be programmed at the address specified in address field of configuration register 301. An internal timer (not shown, but well known in the art) ends the programming pulse at the appropriate time if TAP controller 201 remains in Run-Test-Idle state 403. If TAP controller 201 leaves this state prematurely, the programming pulse is terminated as soon as this state is exited.

When the programming pulse ends, the device automatically performs verification by reading back the value of the data addressed by address field of the configuration register 301 and comparing it with the expected data in the PDATA field. A comparator 305 (not shown in detail, but well known in the art) can be used for the compare operation. If they are the same, indicating that the programming was successful, the status field part of the configuration register is loaded with the 11 code in the Capture-DR state. Otherwise, the status filed is loaded with 01 to indicate that the operation completed but the programming did not succeed.

The FVFY instruction is used to read back the data at any addressed location in the device when no prior program or erase operation is desired. The FVFY instruction, like the FPGM instruction, when shifted into instruction register 103, selects configuration register 301 as the active data register. For the verify mode, the desired address is shifted into the configuration register 301 with a code of "10" in status field 301. While address information is needed to execute the FVFY instruction, data information is not needed. Thus, the bits stored in the data field of configuration register 301 are "don't cares."

After TAP controller 201 enters the Run-Test-Idle state 403, controller 201 detects this status code, thereby triggering a verify pulse of a specified length. When the verify pulse is terminated, either by the internal timing or by leaving Run-Test-Idle state 403, the state of the memory cell at the addressed location is loaded into data field of configuration register 301. This state may then be shifted out through TDO pin 207 for inspection. The code of status field of configuration register 301 in this case is "11, thereby indicating that the verify operation has completed. A code of "00" indicates that the status was checked before the operation was done.

In addition to the instructions set described above, the invention introduces special instructions to initiate programming and verification routines with an auto-increment address feature. This feature provides users with an option to invoke the address auto-increment feature when desired. Table 3 is a set of new instructions according to one embodiment of the invention.

TABLE 3

| Instruction | Function | OpCode |
| --- | --- | --- |
| FPGMI | auto-increment the address during in-system programming | 11101011 |
| FVFYI | auto-increment the address during in-system verification | 11101111 |

The two ISP instructions, FPGMI and FVFYI, select only the PDATA field and status field portions of the register to be connected between TDI pin 205 and TDO pin 207. When either of these instructions is active, the address field is determined by an on-chip address counter which auto-increments each time the Update-DR state is entered with the valid status field code (i.e. ST[1:0]=10). The status field is used to indicate the success or failure of a particular operation during reconfiguration.

FPGMI instruction supports auto-incrementing of the memory cell address during in-system programming. This instruction enables the configuration register 301 such that when the data is properly aligned in configuration register 301 the falling edge of TCK in the Update-DR state of TAP controller 201 allows the new PDATA packet to be updated into the parallel latch of the register. However, unlike the FPGM instruction, the FPGMI instruction allows programming to proceed without having to load addresses from TDI pin 205 or external sources into address field of configuration register 301. The address field is controlled by an on-chip address counter which auto-increments to the next valid address each time the Update-DR state is entered with the valid status field code (i.e. 10) in configuration register 301. An onchip address counter can be provided by the seventeen (17) bit shift register portion of configuration register 301 that performs dual function or by a separate counter that resides somewhere on the chip.

The FVFYI instruction is used to verify the content of programmable memory cells at the locations specified by, for example, address field of the configuration register 301. After the FVFYI instruction is loaded, data (this is don't care bits) is shifted into configuration register 301 for verifying with a data scan cycle. When shifting in the "don't care" data for verifying the PDATA bits the status field must contain the code "10" or the FVFYI instruction is not allowed to operate on that address. When the data is properly aligned in configuration register 301, the falling edge of TCK in the Update-DR state allows the new address to be updated into the parallel latch of configuration register 301. For the verify mode, the status field code "10" must be shifted into configuration register 301. After TAP controller 201 enters the Run-Test-Idle state 403, controller 201 detects this status code, thereby triggering a verify pulse of a specified length. When the verify pulse is terminated, either by the internal timing or by leaving Run-Test-Idle state 403, the state of the memory cell at the addressed location is loaded into data field of configuration register 301. This state may then be shifted out through TDO pin 207 for inspection. The code of status field of configuration register 301 in this case is "11", thereby indicating that the verify operation has completed. A code of "00" indicates that the status was checked before the operation was done.

The FPGMI and FVFYI instructions of the invention eliminate the need to shift in address information for programming and verification. Since the address sequence is automatically generated on-chip by a suitable means such as address/counter portion of configuration register 301, there is no need to shift in address information along with data information. The FPGMI and FVFYI instructions may be used in cooperation with the FPGM and FVFY instructions, respectively. For example, the FPGM instruction may be issued prior to using the FPGMI instruction to load the starting address into the address field portion of configuration register 301. When the FPGMI instruction is subsequently issued, the address counter will begin counting from the initial address.

For efficient verification of the data read back from memory cells, the invention uses a signature analysis method. Signature analysis provides an efficient solution to the data explosion problem that occurs when a large quantity of data has to be read back and verified for testing. By using a signature analysis method, the invention avoids this data storage problem and reduces the time required for the verification routine.

In the preferred embodiment of the invention, a linear feedback shift register (LFSR) is used to generate a signature for a bit stream as Signature Analyzer 303 of FIG. 3. However, it would be appreciated by one skilled in the art that other suitable methods can be used to implement a signature analyzer or checksum generator. For example, it is possible to count the number of 1's in the data bit stream.

Figure 5:
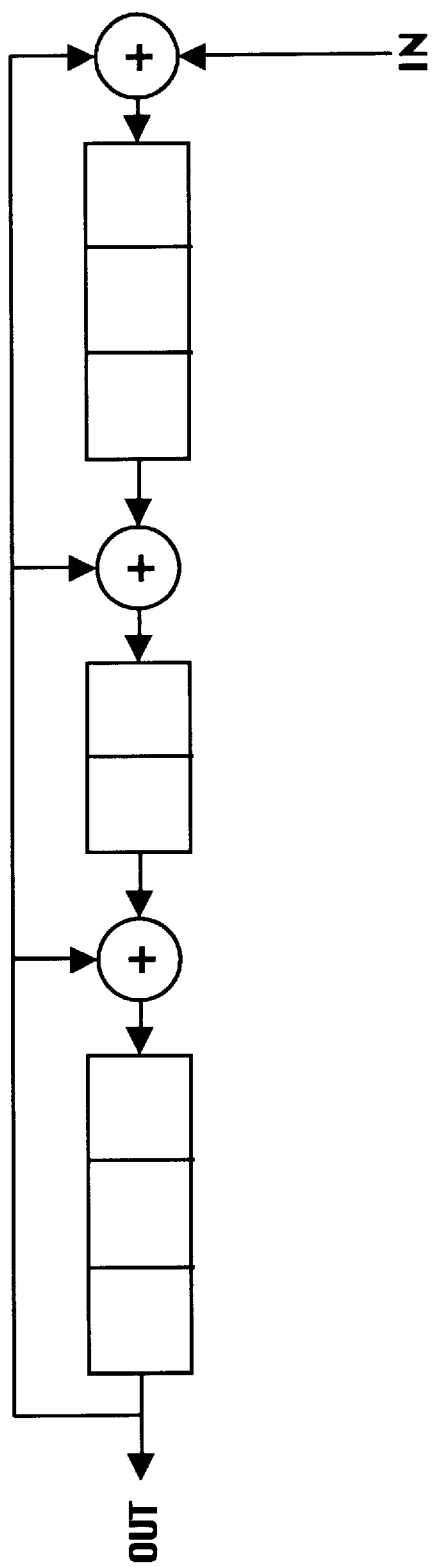
FIG. 5 is an example of a single input linear feedback shift register (SISR) that can be used to implement the linear feedback shift register (LFSR) of FIG. 3.

FIG. 5 is an example of a single input linear feedback shift register (SISR) that can be used to implement Signature Analyzer 303. The SISR in FIG. 5 is represented by the polynomial:

$$p(x)=x^8+x^5+x^3+1$$

Referring to FIG. 5, the rectangular boxes represent storage elements or registers while the circled plus signs represent EX-OR operations.

Suppose incoming data stream is represented by a polynomial m(x) of degree eight (8). Then the circuit in FIG. 5 performs a division operation as follows:

$$m(x)=q \cdot p(x)+r(x),$$

where q=quotient, and r(x)=remainder.

After eight shifts the output of the LFSR yields a quotient. The contents of the storage elements (in one embodiment, flip-flops) are then called the signature and represent the remainder of the division operation. Since the signature constitutes a near-unique checksum for a given sequence of input values, comparing the resultant signature with the expected signature value reveals an error or fault in programming.

However, "aliasing" can occur when two different input sequences result in the same programming signature. Aliasing occurs if and only if error stream e(x) is divisible by the polynomial p(x). If the error polynomial e(x) is not divisible by p(x), the signature contained in the storage elements or registers reveals the presence of the error. It would be appreciated by one skilled in the art that a suitable polynomial p(x) can be chosen to minimize the probability of aliasing error and that the polynomial used above serves as an example, not intended to limit the scope of the invention.

The level of uniqueness of the resulting signature is dependent upon the length of the LFSR (in bits) and the selection of feedback polynomial. For example, it is known that, if the polynomial has an even number of terms, then it will detect all odd numbers of errors. By choosing an appropriate polynomial and its degree, aliasing can be reduced to a negligible level. Generally, the number of the bits in the LFSR is set to be twice the number of input data bits and every output bits in the LFSR should be convolved with the previous stage's input bit.

Figure 6:
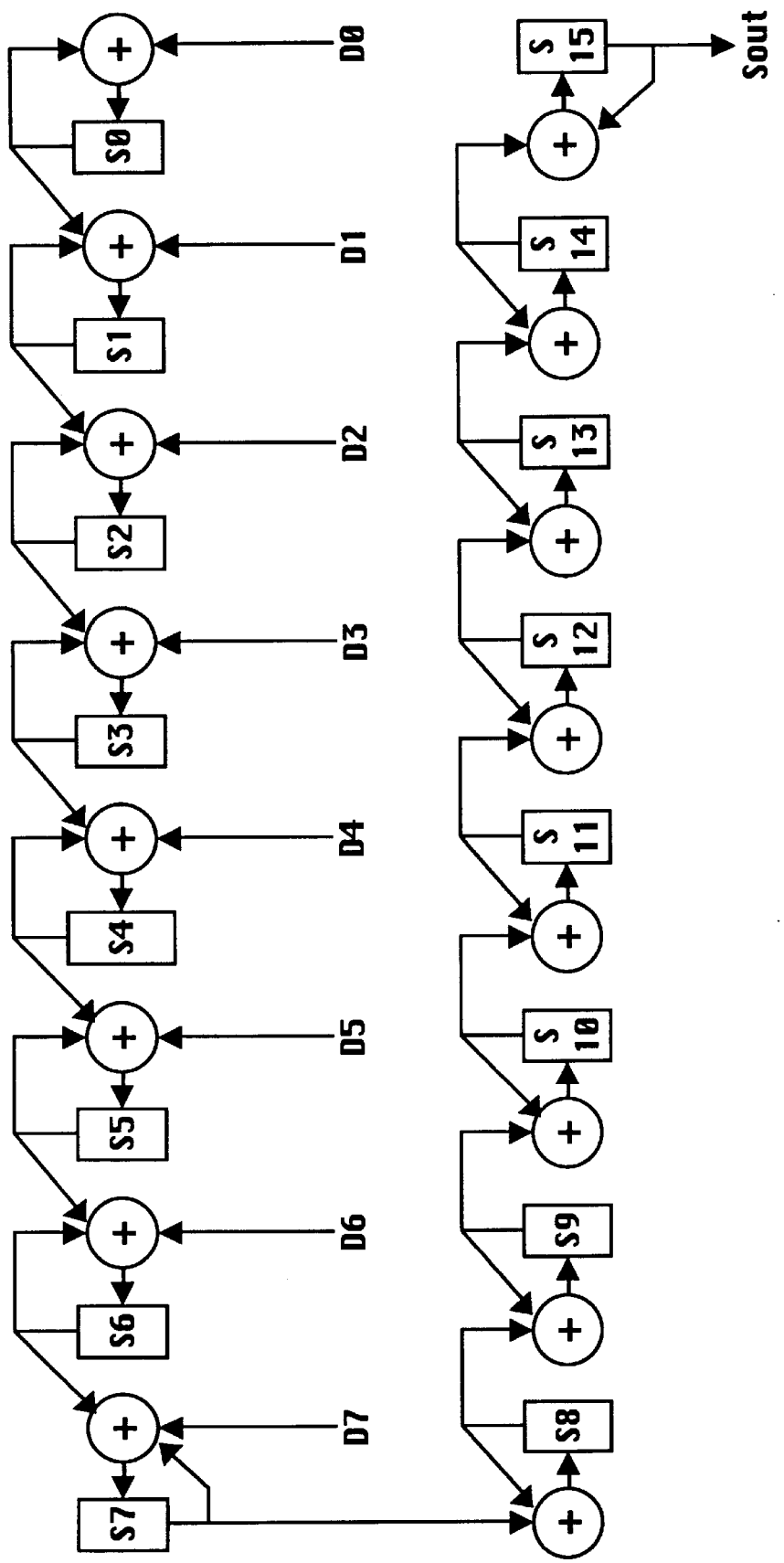
FIG. 6 is a block diagram of a multiple input shift register (MISR) that can be used in accordance with the invention.

FIG. 6 shows an alternate embodiment of the LFSR signature analyzer used in accordance with the invention. In FIG. 6, there are eight data inputs D0, D1, D2, . . . , D7 coupled to the EX-OR gates of the LFSR. Sixteen storage elements S0, S1, S2, . . . , S15 represent the signature flip-flops. These flip-flops store the accumulated signature or checksum. Since there are multiple inputs coupled to LFSR, this type of signature analyzer is known as multiple input LFSR or MISR. The MISR shown in FIG. 6 forms a signature or checksum on eight (8) inputs in parallel. MISRs can compress test response data with reduced area overhead and testing time.

It would be appreciated by one skilled in the art that the particular MISR architecture shown in FIG. 6 serves as an example, and any other suitable MISR architecture can be used without departing from the scope of the invention. For example, different tab points can be used to couple inputs to different EX-OR gates of FIG. 6. This changes the characteristic polynomial and its error detection capability. Additional EX-OR gates can be added to the MISR to realize more complex characteristic polynomial.

Figure 7A:
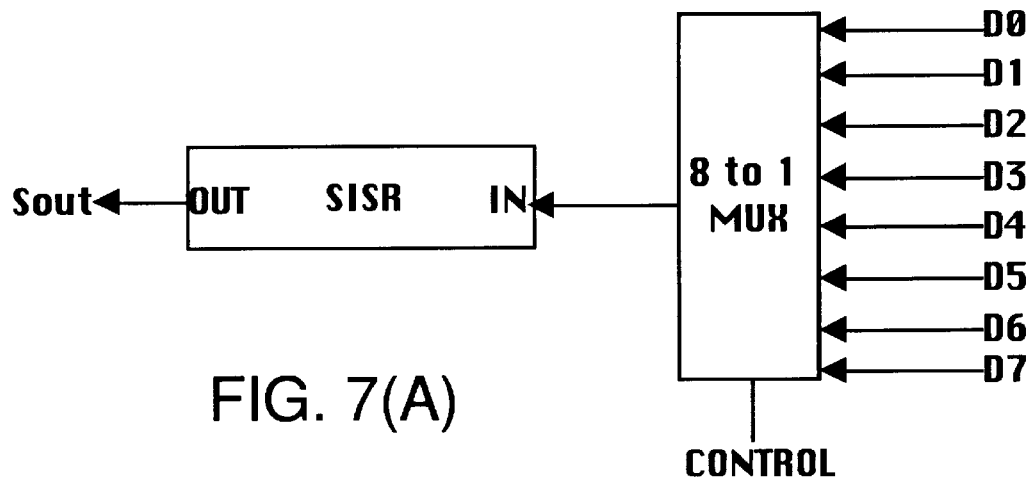
FIG. 7(A) is a block diagram of the LFSR of FIG. 3 that uses an SISR in accordance with the invention.

FIG. 7(A) shows a block diagram of Signature Analyzer 303 (FIG. 3) that uses an SISR in accordance with one embodiment of the invention. Using this embodiment, a signature for D0 is obtained by shifting in D0 bits from all desired memory cells. Once the D0 signature is obtained, input is switched to shift in D1 bits of memory cell data to obtain the signature for D1. Input multiplexing or selection can be implemented by using a simple multiplexer or a switch with a synchronization signal and control signals. This process repeats until all signatures for the width of data, eight bits in this particular embodiment, have been obtained. This embodiment requires minimal silicon area at the cost of additional testing time due to serialized signature generation.

Figure 7B:
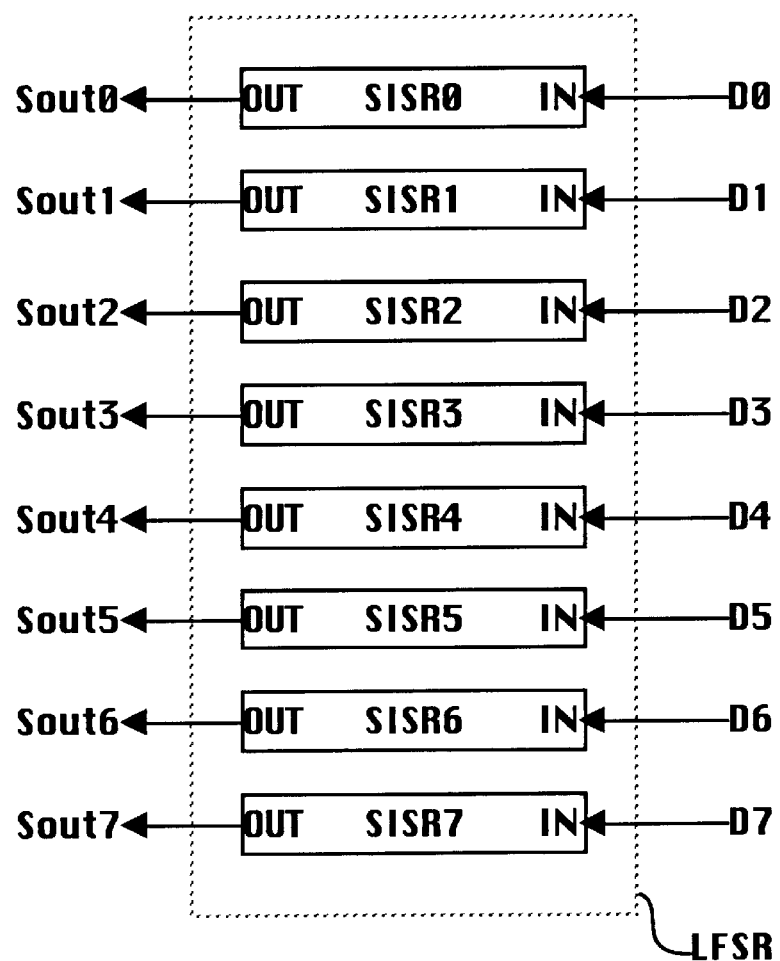
FIG. 7(B) is a block diagram of an alternate embodiment of the LFSR of FIG. 3 that uses an SISR according to the invention.

FIG. 7(B) shows an alternate embodiment of the Signature Analyzer 303 according to the invention. In this embodiment, D0, D1, . . . , D7 bits of data are coupled to SISR0, SISR1, . . . , SISR7, respectively. Since one SISR is dedicated to each bit of data to generate a signature and eight SISRs work in parallel, this embodiment reduces the amount of time to generate a signature.

Figure 8:
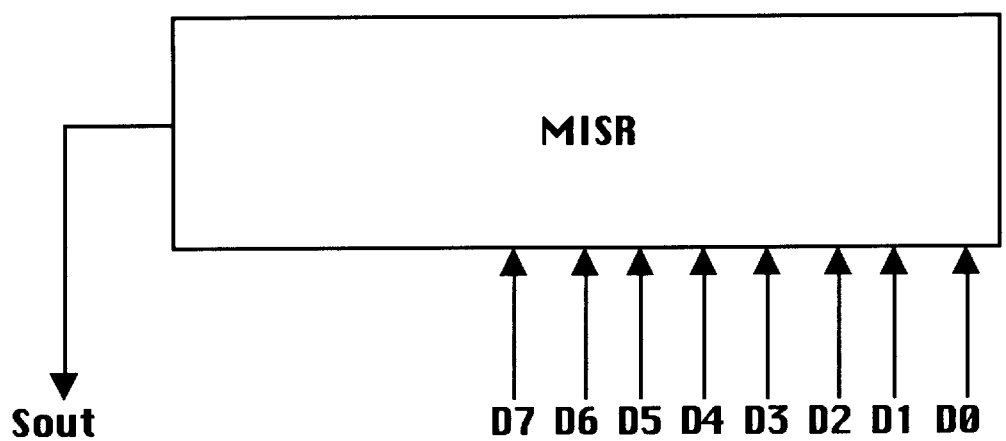
FIG. 8 is a block diagram of one embodiment of the LFSR that uses an MISR in accordance with the invention.

Yet another alternate embodiment of the Signature Analyzer 303 is shown in FIG. 8. In FIG. 8, an MISR is used with parallel inputs D0, D1, . . . , D7 coupled to it. Since inputs are processed in parallel, this embodiment forms a signature much faster than a serialized approach.

The Signature Analyzer 303 used in the invention can be synchronized with the program data read out pulse such that when the new programming data values are made available they are convolved with the accumulated signature bits. Once all of the device programming addresses have been read, the contents of the programming signature register represent the final accumulated signature value, which are shifted out and read serially from TDO pin.

Once the contents of all desired memory cells have been shifted in, Signature Analyzer 303 forms a final checksum signature value. The final checksum then can be shifted out of Signature Analyzer 303 through TDO pin 207 for inspection. For example, the expected checksum can be precalculated using the same polynomial routine as Signature Analyzer 303 and using any suitable means, such as computer software or circuit hardware. A comparison is then made between the expected checksum and the TDO output to verify whether the programming has been successful.

Referring back to FIG. 3, a special instruction FDUMP can be used to the dump the content of Signature Analyzer 303 through TDO pin 207. The FDUMP instruction can use a suitable OpCode from available OpCode space. Alternatively, the content of Signature Analyzer 303 can be shifted serially into PDATA registers portion of configuration register 301 to be shifted out of the PDATA registers through TDO pin 207. In this case, special instruction FDUMP is not necessary and a signature checksum can be dumped through the existing data path.

Alternatively, Signature Analyzer 303 can be coupled to configuration register 301 to receive programming data bits read into the data field of configuration register 301 and route the accumulated checksum to TDO pin 207. If an LFSR is used for Signature Analyzer 303, the LFSR may even share a portion of the existing configuration register, for example, the PDATA portion of configuration register 301. Only eight additional storage elements are then needed to implement a sixteen bit LFSR.

Figure 9:
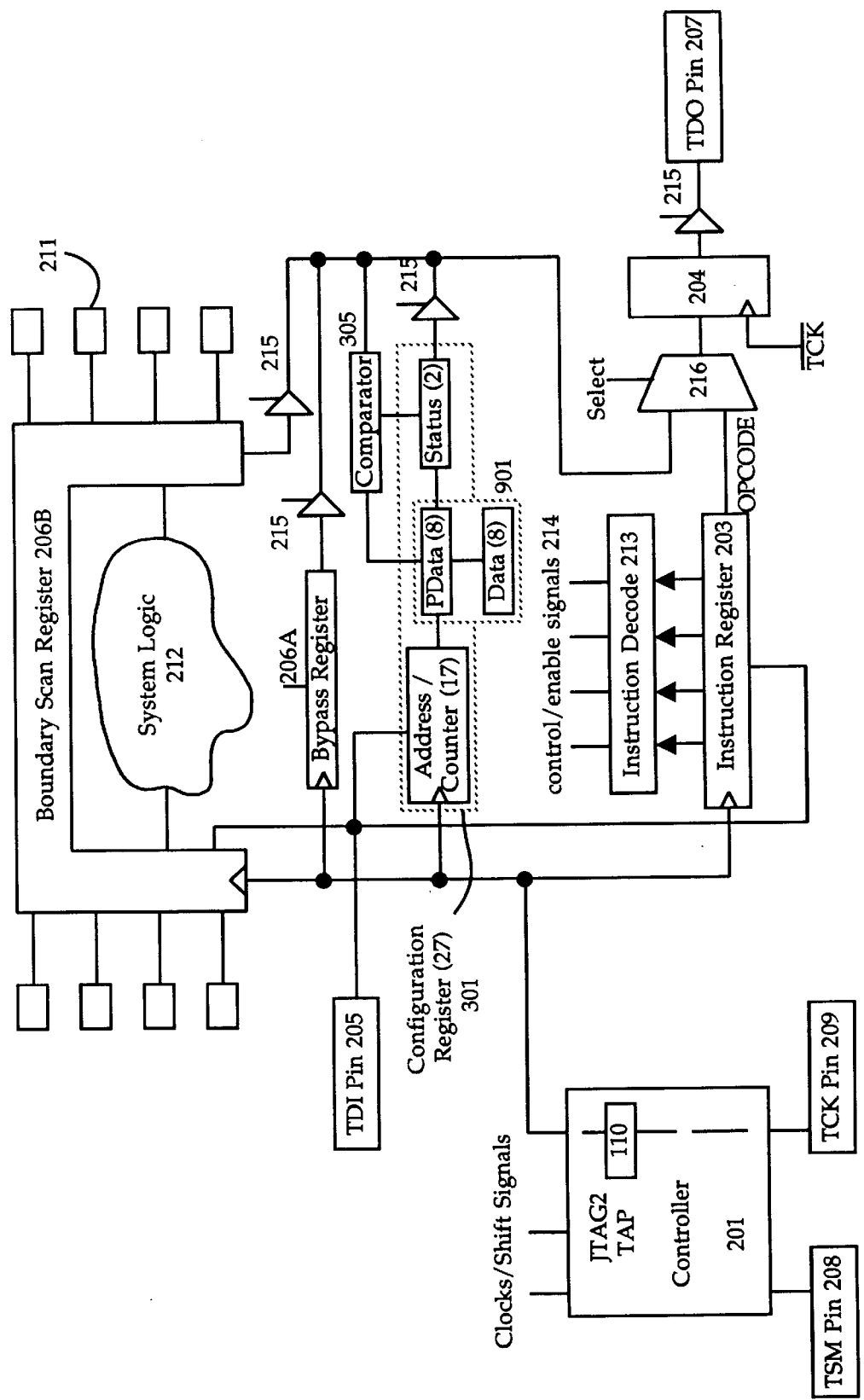
FIG. 9 is a block diagram of an alternate embodiment of the LFSR in accordance with the invention.

FIG. 9 shows an alternate embodiment of Signature Analyzer 901 that uses an LFSR in accordance with the invention. In FIG. 9, instead of using a separate sixteen (16) bit register, the eight storage elements for PDATA field of configuration register 301 is combined with an additional eight storage elements to constitute a sixteen (16) bit LFSR signature analyzer 901. In this embodiment, when the FVFYI instruction is invoked, the LFSR function is enabled in signature analyzer 901 and PDATA [0:7] registers and the additional eight registers work in tandem as an MISR to generate a signature checksum. The mode switch from the regular eight (8) bit register operation to sixteen (16) bit shift register operation, or vice versa, can be controlled by control/enable signals 214.

Since the embodiment of FIG. 9 can use the existing data path to shift out the checksum through PDATA registers and to TDO, FDUMP instruction is not required and an existing instruction that reads out the content of configuration register 301 through TDO pin 207 can be used to read the signature value in the LFSR 901.

Thus, a method and apparatus for efficient programming verification of PLDs has been described in conjunction with one or more specific embodiments. It is understood that particular embodiments described herein are illustrative only and should not limit the present invention thereby. The invention is defined by the claims and their full scope of equivalents.

We claim:

1. A programming verification system for a programmable logic device comprising a system logic including at least one logic gate, and at least one writable memory cell coupled to the system logic, said programming verification system comprising:

an address generator for the at least one writable memory cell; and a signature analyzer that receives the data of said at least one writable memory cell and generates a signature.

2. The system of claim 1 further comprising a data input pin and a data output pin, said data input pin coupled to said address generator, said data output pin coupled to said signature analyzer.

3. The system of claim 2 wherein said address generator is an auto-increment counter with loadability for an initial value.

4. The system of claim 2 wherein said signature analyzer is an MISR (Multiple Input Linear Feedback Shift Register) with input terminals coupled to said data output of said at least one writable memory cell to allow parallel processing of said data.

5. The system of claim 4 wherein said MISR comprises a plurality of storage elements and a plurality of EX-OR gates.

6. The system of claim 2 wherein said signature analyzer is an SISR (Single Input linear feedback Shift Register) with an input terminal coupled to said data output of said at least one writable memory cell to allow serial processing of said data.

7. The system of claim 2 wherein said signature analyzer is an array of SISR's, input terminal of each of said SISR's coupled to a bit of said data output of said at least one writable memory cell.

8. The system of claim 4 wherein said MISR is coupled to said data output pin.

9. The system of claim 6 wherein said SISR is coupled to said data output pin.

10. The system of claim 7 wherein each of said array of SISR's is coupled to said data output pin.

11. A programming verification system for a programmable logic device with in-system programming capability comprising a system logic including at least one logic gate, and at least one writable memory cell coupled to the system logic, said programming verification system comprising:

an instruction register;

an instruction decoder coupled to said instruction register for providing control and enable signals;

a configuration register comprising an address field, a data field; and a signature analyzer that receives the data of said at least one writable memory cell and generates a signature.

12. The system of claim 11 further comprising a data input pin and a data output pin, said configuration register coupled between said data input pin and said data output pin.

13. The system of claim 12 wherein said address field of said configuration register is an auto-incrementable counter.

14. The system of claim 13 wherein said signature analyzer is implemented by coupling a shift register to said data field of said configuration register, thereby forming an LFSR.

15. The system of claim 14 wherein said LFSR comprises a plurality of storage elements and a plurality of EX-OR gates.

16. The system of claim 15 wherein said LFSR is an MISR.

17. The system of claim 14 wherein said signature analyzer is formed by an LFSR coupled between said data input pin and said data output pin, said LFSR further coupled to the data output of said at least one writable memory cell.

18. The system of claim 17 wherein said LFSR is an MISR.

19. The system of claim 13 further comprising an auto-incrementing counter for providing an address for said at least one memory cell.

20. The system of claim 19 wherein said signature analyzer is implemented by coupling a shift register to said data field of said configuration register, thereby forming an LFSR.

21. The system of claim 20 wherein said LFSR is an MISR.

22. The system of claim 19 wherein said signature analyzer is formed by an LFSR coupled between said data input pin and said data output pin, said LFSR further coupled to the data output of said at least one writable memory cell.

23. The system of claim 22 wherein said LFSR is an MISR.

24. A method of verifying the program of a PLD comprising a system logic including at least one logic gate, and at least one writable memory cell coupled to the system logic, comprising the steps of:

loading an initial address of said at least one writable memory cells in an address generator;

updating the address generator with a new address for said at least one writable memory cell;

coupling the data output of said at least one writable memory cell to a signature analyzer;

said signature analyzer generating a signature checksum based upon the data output of said at least one writable memory cell; and comparing said generated signature checksum with an expected signature checksum value.

25. The method of claim 24 wherein said step of updating the address generator comprises the step of:

auto-incrementing said address generator.

26. The method of claim 24 wherein said signature analyzer is an LFSR.

27. The method of claim 26 further comprising the steps of:

loading an instruction into an instruction register;

decoding said instruction and providing control/enable signals for said address generator, and said LFSR.

* * * * *